United States Patent
Akahori

(10) Patent No.: US 11,381,005 B2
(45) Date of Patent: Jul. 5, 2022

(54) SEMICONDUCTOR DEVICE, COMMUNICATION SYSTEM, AND METHOD OF MANUFACTURING SEMICONDUCTOR DEVICE

(71) Applicant: LAPIS Semiconductor Co., Ltd., Yokohama (JP)

(72) Inventor: Hiroji Akahori, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 17/001,643

(22) Filed: Aug. 24, 2020

(65) Prior Publication Data

US 2020/0388932 A1    Dec. 10, 2020

Related U.S. Application Data

(62) Division of application No. 15/603,468, filed on May 24, 2017, now Pat. No. 10,784,587.

(30) Foreign Application Priority Data

Jun. 13, 2016  (JP) ................................ 2016-117405

(51) Int. Cl.
| | |
|---|---|
| *H01Q 1/22* | (2006.01) |
| *H01Q 21/00* | (2006.01) |
| *H01Q 1/24* | (2006.01) |
| *H01Q 1/48* | (2006.01) |
| *H01Q 21/29* | (2006.01) |

(52) U.S. Cl.
CPC ....... *H01Q 21/0087* (2013.01); *H01Q 1/2283* (2013.01); *H01Q 1/243* (2013.01); *H01Q 1/48* (2013.01); *H01Q 21/0025* (2013.01); *H01Q 21/29* (2013.01); *H01L 2224/11* (2013.01)

(58) Field of Classification Search
CPC .. H01Q 1/2208; H01Q 21/0093; H01Q 1/243; H01Q 1/38; H01Q 1/2283
See application file for complete search history.

(56) References Cited

U.S. PATENT DOCUMENTS

| | | | | |
|---|---|---|---|---|
| 5,386,214 A | * | 1/1995 | Sugawara | ............ H01Q 9/0457 |
| | | | | 343/700 MS |
| 5,903,239 A | * | 5/1999 | Takahashi | ............ H01Q 1/2283 |
| | | | | 343/700 MS |

(Continued)

FOREIGN PATENT DOCUMENTS

| | | |
|---|---|---|
| CN | 101013674 | 8/2007 |
| CN | 101971519 | 2/2011 |
| WO | 2016056387 | 4/2016 |

OTHER PUBLICATIONS

"Office Action of China Counterpart Application", dated Dec. 29, 2021, with English translation thereof, pp. 1-15.

*Primary Examiner* — Hasan Z Islam
(74) *Attorney, Agent, or Firm* — JCIPRNET

(57) ABSTRACT

A semiconductor device includes a first antenna element, a second antenna element, and a semiconductor chip including a communication circuit that is connected to the first antenna element and the second antenna element. The first antenna element and the second antenna element are disposed on opposite surfaces of the semiconductor chip. The first antenna element or the second antenna element to which a ground potential is applied has a grid-like pattern.

1 Claim, 16 Drawing Sheets

(56) References Cited

U.S. PATENT DOCUMENTS

| | | | |
|---|---|---|---|
| 2010/0033395 A1* | 2/2010 | Ding | H01Q 9/26 |
| | | | 343/834 |
| 2010/0181379 A1* | 7/2010 | Okegawa | H01Q 13/106 |
| | | | 235/488 |
| 2012/0038445 A1 | 2/2012 | Finn | |
| 2015/0145108 A1 | 5/2015 | Yap et al. | |
| 2016/0261036 A1* | 9/2016 | Sato | H01Q 23/00 |

* cited by examiner

SEMICONDUCTOR DEVICE, COMMUNICATION SYSTEM, AND METHOD OF MANUFACTURING SEMICONDUCTOR DEVICE

CROSS-REFERENCE TO RELATED APPLICATION

This application is a divisional application of and claims the priority benefit of U.S. application Ser. No. 15/603,468, filed on May 24, 2017, now allowed, which claims the priority benefit of Japan Application no. 2016-117405, filed on Jun. 13, 2016. The entirety of each of the above-mentioned patent applications is hereby incorporated by reference herein and made a part of this specification.

BACKGROUND OF THE INVENTION

Field of the Invention

The invention relates to a semiconductor device, a communication system, and a method of manufacturing the semiconductor device.

Description of Related Art

A semiconductor device including an antenna for wireless communication on a surface thereof is known. For example, Patent Literature 1 discloses a semiconductor device including two through electrodes formed by penetrating a semiconductor chip, in which a ground layer connected to one of the through electrode and a patch antenna connected to the other of the through electrode are stacked on one surface of the semiconductor chip with an inorganic insulating layer therebetween.

Further, Patent Literature 2 discloses a semiconductor device having an antenna with a loop portion in a loop shape on a substrate, in which a capacitor connected in parallel to the antenna is provided at a base of the loop portion.

PRIOR ART LITERATURE

Patent Literature

Patent Literature 1: Japanese Patent Publication No. 2009-158743
Patent Literature 2: Japanese Patent Publication No. 2010-135500

In wireless communication of the related art, an antenna with high efficiency is used to obtain a sufficient communication distance that is necessary for a system operation. However, in recent years, systems that perform wireless communication in a communication section over a relatively short distance have increased in number. For example, there are a number of systems having a communication distance of a few millimeters to a few meters as in a radio frequency identifier (RFID). Further, in recent years, an attempt has also been made to perform an authenticity determination using wireless communication. In many cases, it is preferable for the wireless communication device for such a use to be as small as possible in view of characteristics of the use. As there is strong demand for miniaturization of wireless communication devices, miniaturization of the antenna is also required. In mobile devices such as smart phones, designs in which the presence of antennas is not conveyed have become mainstream, and the miniaturization of the antenna has gained commercial value.

By using a rewiring technology known in the field of a semiconductor device, it is possible to form a small antenna on a semiconductor chip. However, with a configuration of the related art, it is difficult to form an antenna having necessary and sufficient performance.

SUMMARY OF THE INVENTION

The invention achieves high performance of an antenna that is formed within a semiconductor device.

A semiconductor device according to the invention includes a first antenna, a second antenna and a semiconductor chip including a communication circuit that is connected to the first antenna element and the second antenna element. The first antenna element and the second antenna element are disposed on opposite surfaces of the semiconductor chip. The first antenna element or the second antenna element to which a ground potential is applied has a grid-like pattern.

According to the invention, it is possible to achieve high performance of antennas formed within the semiconductor device.

DETAILED DESCRIPTION OF THE INVENTION

Figure 1:
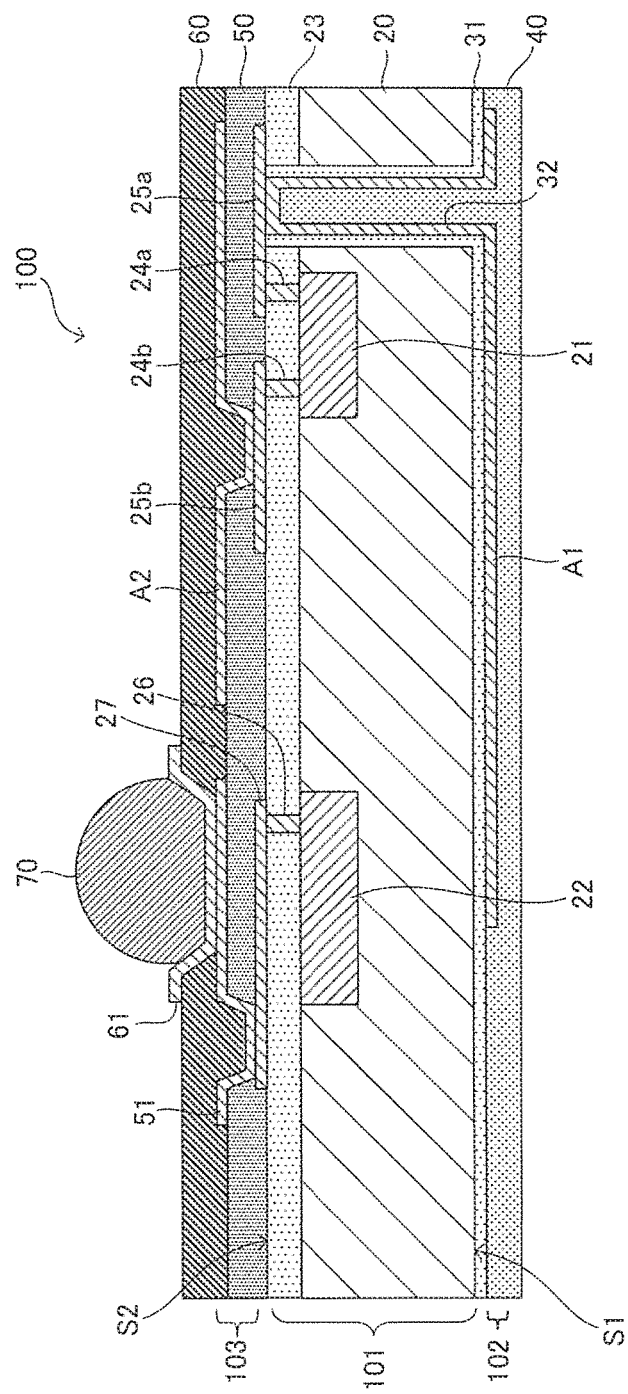
FIG. 1 is a cross-sectional view illustrating a configuration of a semiconductor device according to an embodiment of the invention.

Hereinafter, an example of an embodiment of the invention will be described with reference to the drawings. In the drawings, the same or equivalent components and portions are denoted with the same reference signs.

First Embodiment

FIG. 1 is a cross-sectional view illustrating a configuration of a semiconductor device 100 according to an embodiment of the invention. The semiconductor device 100 has a form of a wafer-level chip size package (WL-CSP). The semiconductor device 100 includes a semiconductor chip 101 including a communication circuit 21, a first antenna element A1 formed in a first rewiring layer 102 covering a first surface S1 of the semiconductor chip 101 and connected to the communication circuit 21, and a second antenna element A2 formed in a second rewiring layer 103 covering a second surface S2 on a side opposite to the first surface S1 of the semiconductor chip 101 and connected to the communication circuit 21.

The semiconductor chip 101 includes, for example, a semiconductor substrate 20 formed of silicon, an insulating film 23 formed of an insulator such as an SiO2 film, vias 24a, 24b, and 26, and electrode pads 25a, 25b, and 27. The communication circuit 21 that performs wireless communication with a communication device 150 (see FIG. 2) provided outside the semiconductor device 100 is provided on a circuit formation surface of the semiconductor substrate 20. The communication circuit 21 has a function of at least one of transmission and reception. A power supply circuit 22, for example, is provided as a circuit other than the communication circuit 21 on the circuit formation surface of the semiconductor substrate 20. The electrode pads 25a and 25b are connected to the communication circuit 21 via the vias 24a and 24b, respectively. The electrode pad 27 is connected to the power supply circuit 22 via the via 26.

The second surface S2 of the semiconductor chip 101 is covered with an insulating film 50 formed of polyimide, polybenzoxazole (PBO), or the like. The second antenna element A2 and a circuit wiring 51 formed by rewiring in the second rewiring layer 103 are provided on a surface of the insulating film 50. The second antenna element A2 is connected to the communication circuit 21 via the electrode pad 25b and the via 24b. The circuit wiring 51 is connected to the power supply circuit 22 via the electrode pad 27 and the via 26.

A surface of the second rewiring layer 103 is covered with a sealing film 60 formed of an insulator such as a photosensitive resin, for example. A terminal pad 61 is connected to the circuit wiring 51 exposed at an opening formed in the sealing film 60. An external connection terminal 70 including a solder ball is provided on a surface of the terminal pad 61.

In the semiconductor chip 101, a through electrode 32 reaching the electrode pad 25a from the first surface S1 is provided. The through electrode 32 and the semiconductor substrate 20 are insulated by an insulating film 31 formed of an insulator such as SiO2 provided therebetween. The insulating film 31 also covers the entire first surface S1 of the semiconductor chip 101.

The first antenna element A1 formed by rewiring in the first rewiring layer 102 is provided on the surface of the insulating film 31. The first antenna element A1 is connected to the through electrode 32. That is, the first antenna element A1 is connected to the communication circuit 21 via the through electrode 32, the electrode pad 25a, and the via 24a. The first antenna element A1, the insulating film 31, and the through electrode 32 are covered with a sealing film 40 formed of an epoxy resin or the like.

Figure 2:
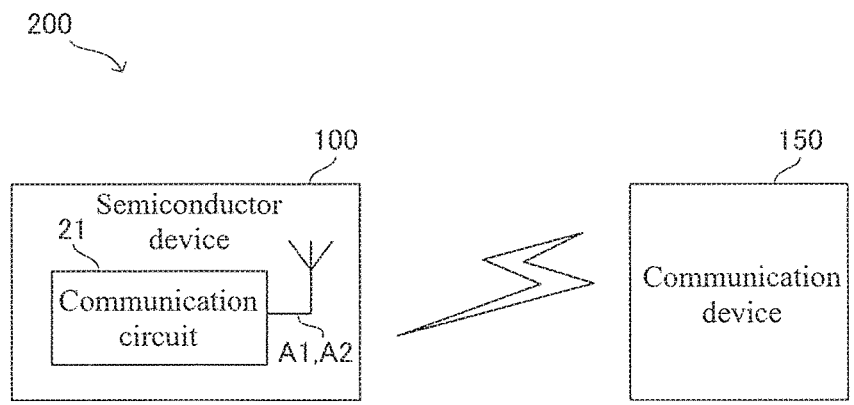
FIG. 2 is a diagram illustrating a configuration of a communication system according to an embodiment of the invention.

FIG. 2 is a diagram illustrating a configuration of a communication system 200 according to the embodiment of the invention. The communication circuit 21 performs wireless communication with the communication device 150 provided outside the semiconductor device 100 using the first antenna element A1 and the second antenna element A2 as antennas for communication.

Figure 3A:
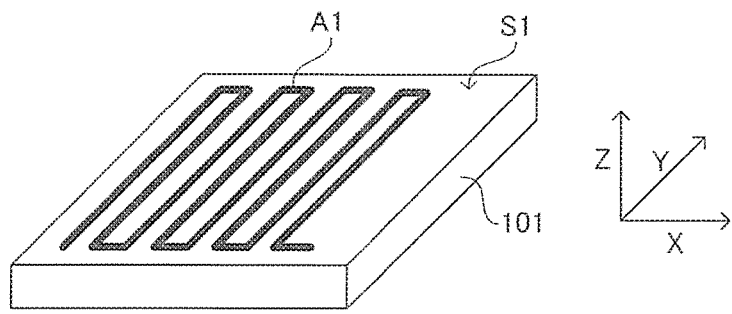
FIG. 3A is a perspective view schematically illustrating a pattern of a first antenna element according to an embodiment of the invention.
Figure 3B:
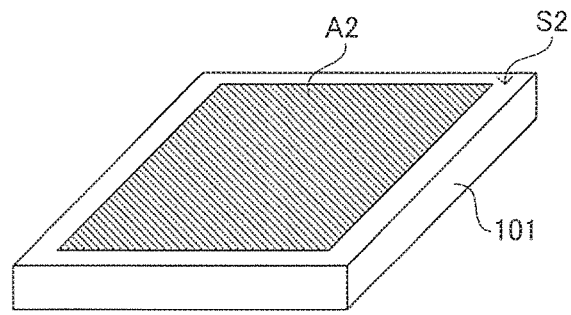
FIG. 3B is a perspective view schematically illustrating a pattern of a second antenna element according to an embodiment of the invention.

FIG. 3A is a perspective view schematically illustrating a pattern of the first antenna element A1 formed in the first rewiring layer 102. FIG. 3B is a perspective view schematically illustrating a pattern of the second antenna element A2 formed in the second rewiring layer 103.

As illustrated in FIG. 3A, the first antenna element A1 has a one line pattern in which a rewiring is caused to reciprocate meanderingly in a Y direction parallel to a side of the semiconductor chip 101. The pattern of the first antenna element A1 is formed by patterning a rewiring formed in the first rewiring layer 102. A wiring length of the antenna element A1 is appropriately determined according to a wavelength of radio waves used for wireless communication, or the like.

On the other hand, as illustrated in FIG. 3B, the second antenna element A2 has an island-like pattern (solid pattern) with which a predetermined area of the second surface S2 of the semiconductor chip 101 is filled. The pattern of the second antenna element A2 is formed by patterning a rewiring formed in the second rewiring layer 103. An arrangement, a shape, and an area of the island-like pattern of the second antenna element A2 are appropriately determined according to a design goal of a radiation pattern or radiation efficiency of radio waves, or the like.

Figure 4:
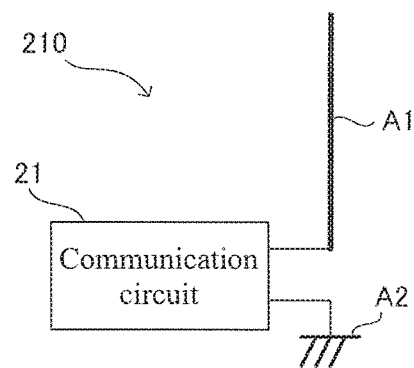
FIG. 4 is a diagram illustrating a configuration of a communication unit according to an embodiment of the invention.

Typically, the semiconductor device 100 according to this embodiment is used by applying a ground potential to the second antenna element A2. FIG. 4 is a diagram illustrating a configuration of a communication unit 210 including the communication circuit 21, the first antenna element A1, and the second antenna element A2 when the ground potential is applied to the second antenna element A2. By applying the ground potential to the second antenna element A2, a monopole antenna is constituted by the first antenna element A1 and the second antenna element A2. That is, the first antenna element A1 functions as an antenna line of the monopole antenna, and the second antenna element A2 functions as a ground plane of the monopole antenna. The application of the ground potential to the second antenna element A2 may be performed via an external connection terminal using the same solder ball as in the external connection terminal 70, for example.

Hereinafter, a method of manufacturing the semiconductor device 100 will be described. FIGS. 5A to 5L are cross-sectional views illustrating an example of the method of manufacturing the semiconductor device 100 according to the embodiment of the invention.

Figure 5A:
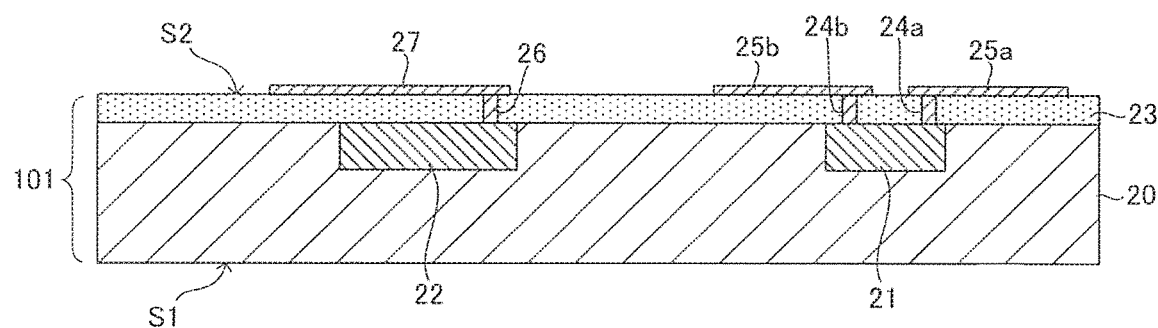
FIG. 5A is a cross-sectional view illustrating an example of a method of manufacturing a semiconductor device according to an embodiment of the invention.

First, the communication circuit 21, the power supply circuit 22, and other circuits as necessary are formed in the semiconductor substrate 20 using a known semiconductor manufacturing process. Subsequently, the insulating film 23 formed of an insulator such as SiO2 is formed on the circuit formation surface of the semiconductor substrate 20 using a known chemical vapor deposition (CVD) method. Subsequently, contact holes are formed at predetermined positions in the insulating film 23 using a known photolithography technology. Subsequently, a conductor film formed of a conductor such as A1 is formed on a surface of the insulating film 23 using a known sputtering method. Accordingly, the conductor is buried in the contact holes formed in the insulating film 23, and the vias 24a and 24b connected to the communication circuit 21 and the via 26 connected to the power supply circuit 22 are formed. Subsequently, the electrode pad 25a connected to the via 24a, the electrode pad 25b connected to the via 24b, and the electrode pad 27 connected to the via 26 are formed by patterning the conductor film using a known photolithography technology (FIG. 5A).

Figure 5B:
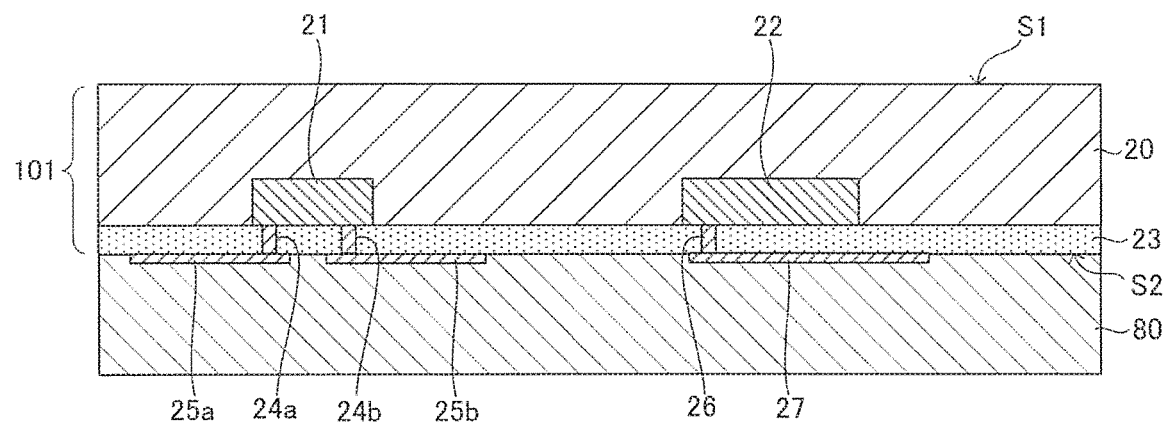
FIG. 5B is a cross-sectional view illustrating an example of a method of manufacturing a semiconductor device according to the embodiment of the invention.

Then, a support substrate 80 is fixed to the second surface S2, which is the formation surface for the electrode pads 25a, 25b, and 27 of the semiconductor chip 101 obtained through the above process, with an adhesive (not shown) (FIG. 5B).

Figure 5C:
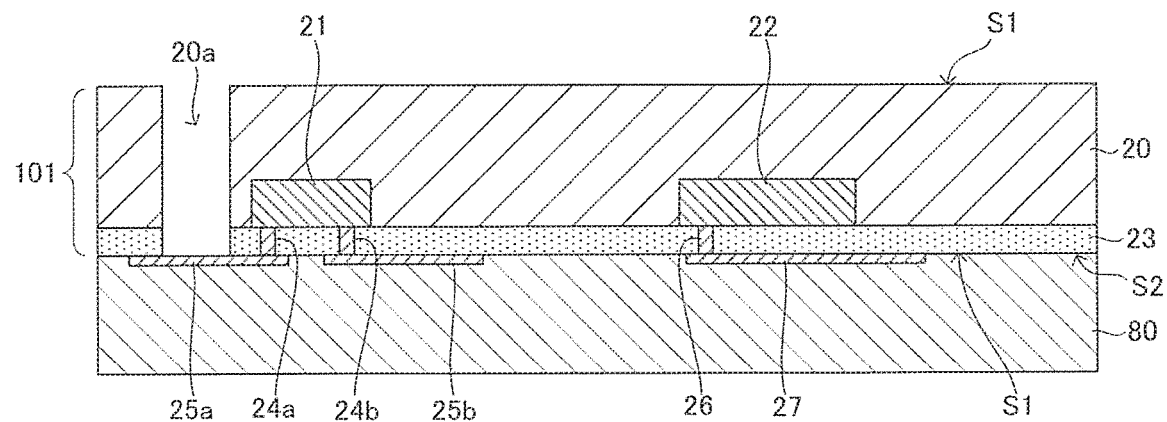
FIG. 5C is a cross-sectional view illustrating an example of a method of manufacturing a semiconductor device according to the embodiment of the invention.

Then, a through hole 20a which penetrates the semiconductor substrate 20 and the insulating film 23 from the first surface S1 of the semiconductor chip 101 and reaches the electrode pad 25a is formed using a known etching technology (FIG. 5C).

Figure 5D:
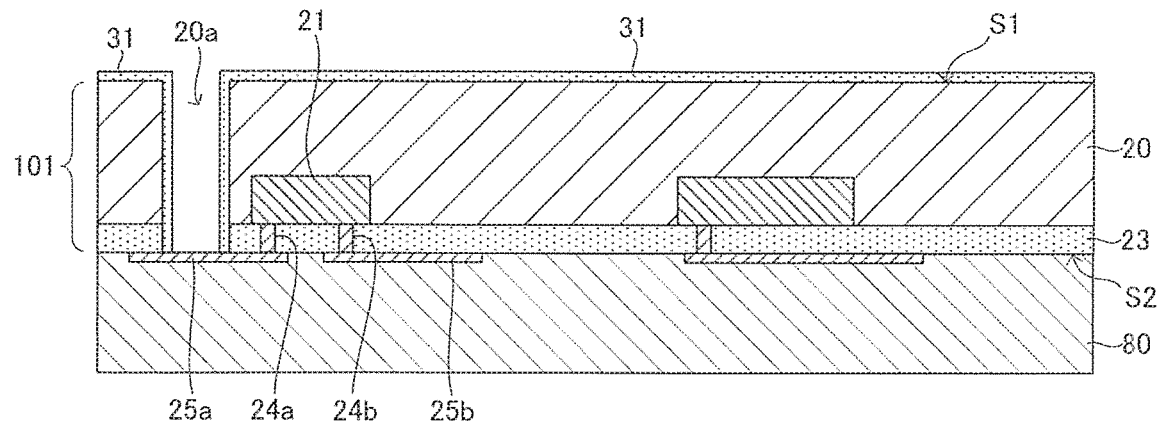
FIG. 5D is a cross-sectional view illustrating an example of a method of manufacturing a semiconductor device according to the embodiment of the invention.

Then, the insulating film 31 formed of an insulator such as SiO2 is formed on the first surface S1 of the semiconductor chip 101 using the known CVD method. Accordingly, a side surface and a bottom surface of the through hole 20a are also covered with the insulating film 31. A portion of the insulating film 31 covering the bottom surface of the through hole 20a is removed by subsequent etching. Accordingly, the electrode pad 25a is exposed in the bottom surface of the through hole 20a (FIG. 5D).

Figure 5E:
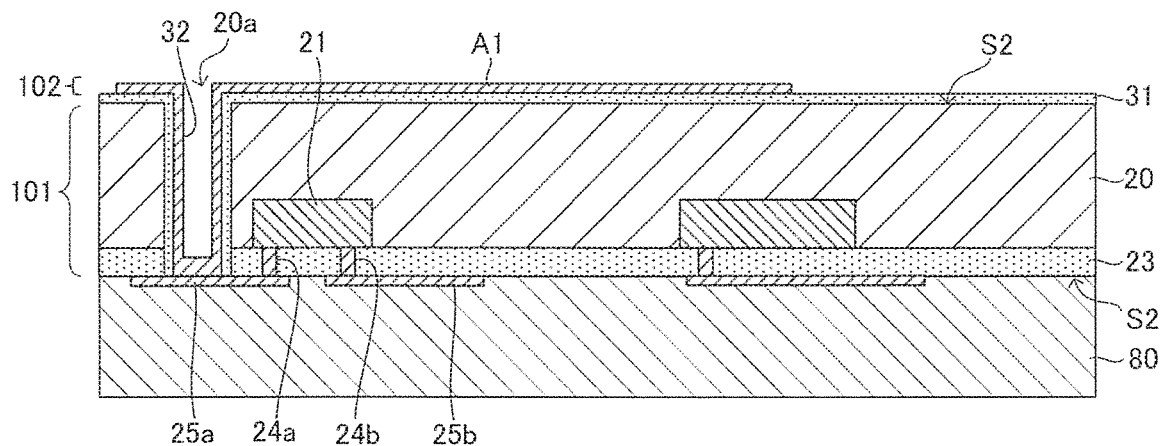
FIG. 5E is a cross-sectional view illustrating an example of a method of manufacturing a semiconductor device according to the embodiment of the invention.

Then, a conductor film formed of a conductor such as Cu that covers the surface of the insulating film 31 and the side surface and the bottom surface of the through hole 20a is formed using a known plating method. This conductor film constitutes the rewiring in the first rewiring layer 102. Subsequently, the conductor film is patterned using the known photolithography technology. Accordingly, the through electrode 32 connected to the electrode pad 25a is formed, and the first antenna element A1 is formed in the first rewiring layer 102 (FIG. 5E). The first antenna element A1 is patterned to have a line pattern as illustrated in FIG. 3A.

Figure 5F:
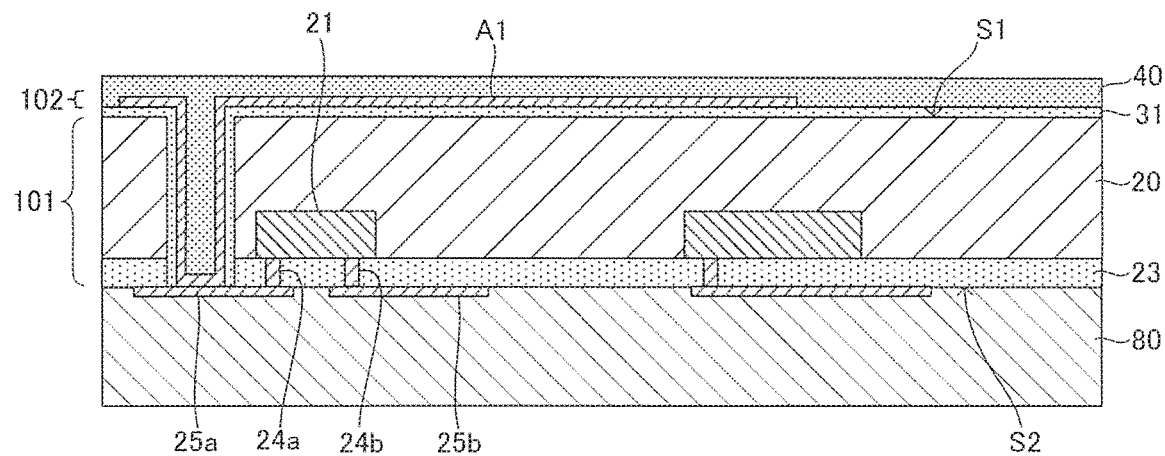
FIG. 5F is a cross-sectional view illustrating an example of a method of manufacturing a semiconductor device according to the embodiment of the invention.

Then, the sealing film 40 formed of epoxy resin or the like and covering the first surface S1 of the semiconductor chip 101 is formed. The first antenna element A1 and the through electrode 32 are covered with the sealing film 40, and the through hole 20a is filled with the sealing film 40 (FIG. 5F).

Figure 5G:
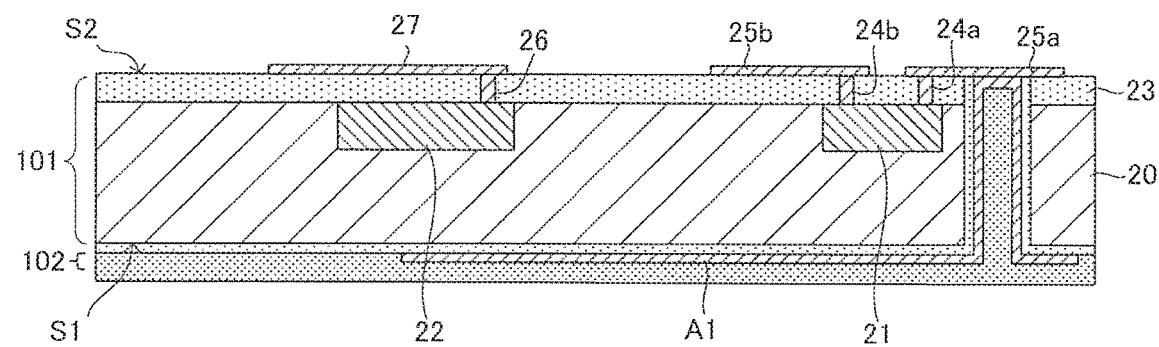
FIG. 5G is a cross-sectional view illustrating an example of a method of manufacturing a semiconductor device according to the embodiment of the invention.

Then, the support substrate 80 is peeled off and the second surface S2 of the semiconductor chip 101 is exposed (FIG. 5G).

Figure 5H:
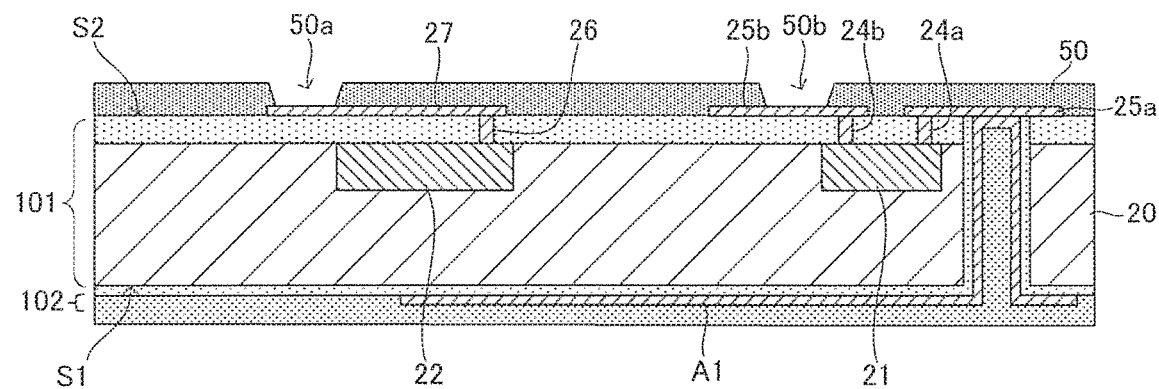
FIG. 5H is a cross-sectional view illustrating an example of a method of manufacturing a semiconductor device according to the embodiment of the invention.

Then, a resin such as polyimide or polybenzoxazole (PBO) is applied onto the second surface S2 of the semiconductor chip 101, and then the resin is cured to form the insulating film 50. Subsequently, openings 50a and 50b are formed in the insulating film 50 using a known photolithography technology. The electrode pad 27 connected to the power supply circuit 22 is exposed at the opening 50a, and the electrode pad 25b connected to the communication circuit 21 is exposed at the opening 50b (FIG. 5H).

Figure 5I:
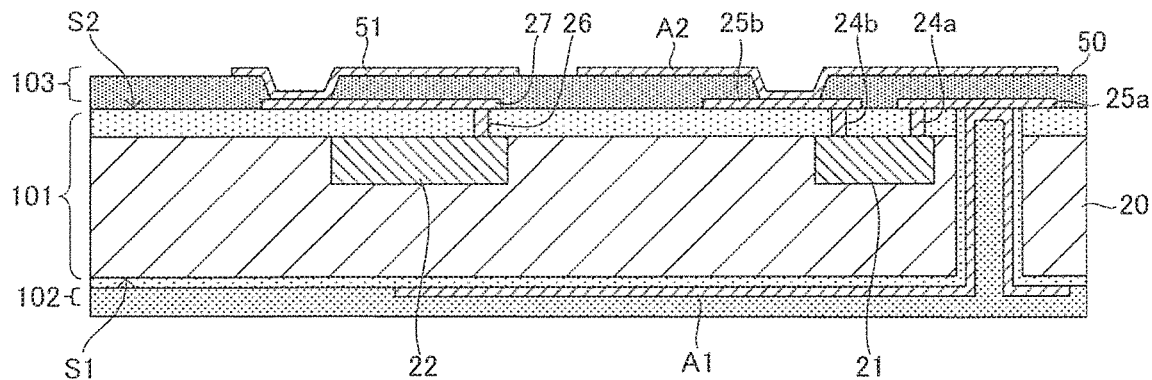
FIG. 5I is a cross-sectional view illustrating an example of a method of manufacturing a semiconductor device according to the embodiment of the invention.

Then, a conductor film formed of a conductor such as Cu and covering the surface of the insulating film 50 is formed using a known plating method. This conductor film constitutes the rewiring in the second rewiring layer 103. Subsequently, the conductor film is patterned using the known photolithography technology. Accordingly, the circuit wiring 51 connected to the electrode pad 27 is formed, and the second antenna element A2 connected to the electrode pad 25b is formed (FIG. 5I). The second antenna element A2 is patterned to have an island-like pattern as illustrated in FIG. 3B.

Figure 5J:
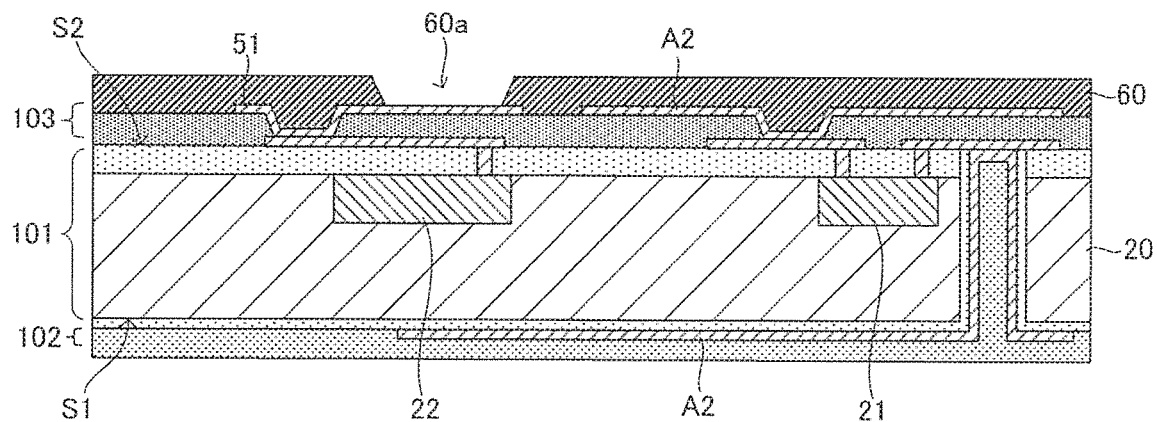
FIG. 5J is a cross-sectional view illustrating an example of a method of manufacturing a semiconductor device according to the embodiment of the invention.

Then, a surface of the second rewiring layer 103 is coated with a photosensitive resin, and then the photosensitive resin is cured to form the sealing film 60. Subsequently, an opening 60a is formed in the sealing film 60 using the known photolithography technology. The circuit wiring 51 is partially exposed at the opening 60a (FIG. 5J).

Figure 5K:
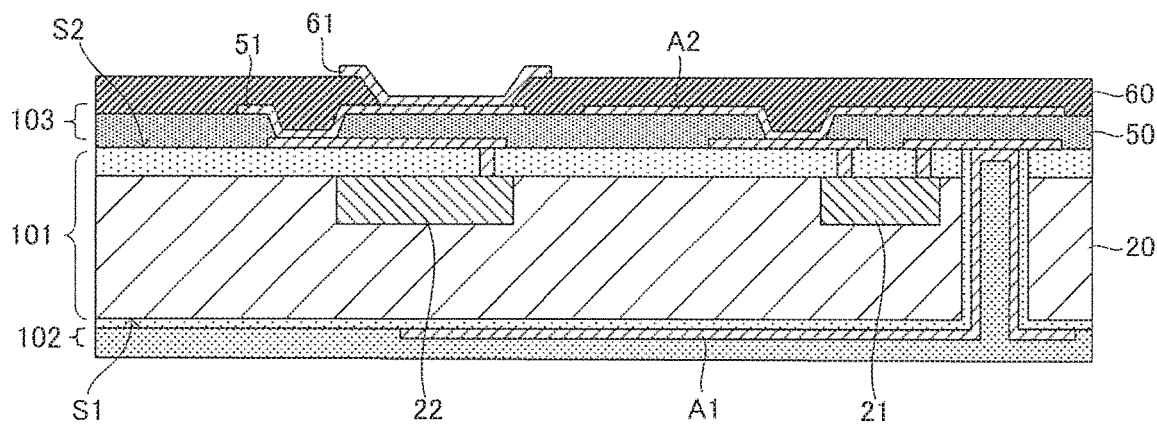
FIG. 5K is a cross-sectional view illustrating an example of a method of manufacturing a semiconductor device according to the embodiment of the invention.

Then, a conductor film formed of a conductor such as Cu and covering a surface of the sealing film 60 is formed using the known plating method. Subsequently, this conductor film is patterned using the known photolithography technology to form the terminal pad 61 connected to the circuit wiring 51 (FIG. 5K).

Figure 5L:
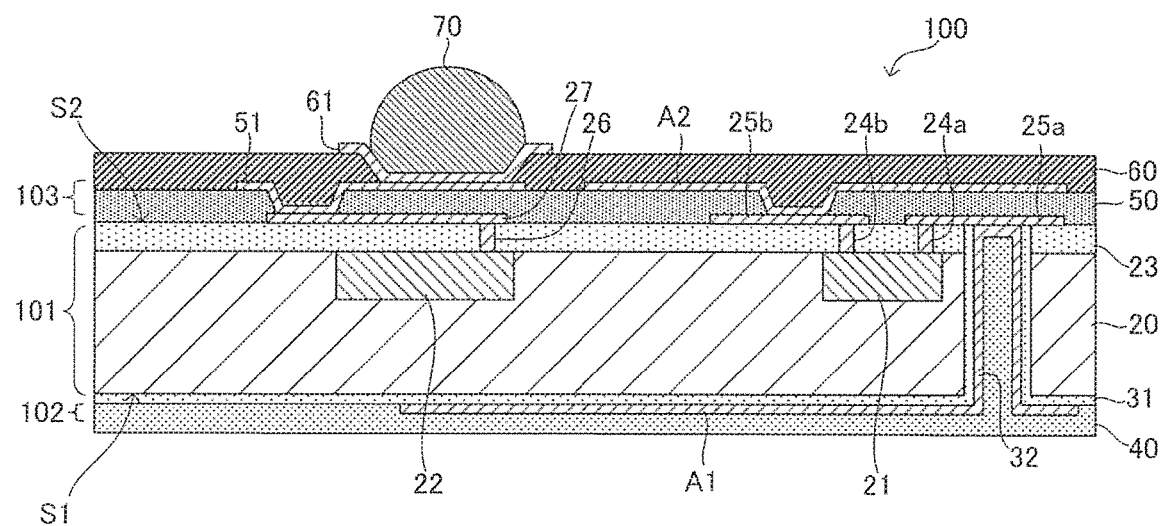
FIG. 5L is a cross-sectional view illustrating an example of a method of manufacturing a semiconductor device according to the embodiment of the invention.

Then, the external connection terminal 70 formed of a solder ball is formed on the terminal pad 61 (FIG. 5L).

As is apparent from the above description, according to the semiconductor device 100 of the embodiment of the invention, the first antenna element A1 is formed in the first rewiring layer 102 that covers the first surface S1 of the semiconductor chip 101 and the second antenna element A2 is formed in the second rewiring layer 103 that covers the second surface S2 of the semiconductor chip 101. By forming the antenna elements in the respective rewiring layers formed on both surfaces of the semiconductor chip 101 in this way, it is possible to constitute an antenna with higher performance than an antenna of the related art.

Further, according to the semiconductor device 100 of this embodiment, by applying the ground potential to the second antenna element A2 having an island-like pattern, the second antenna element A2 can be caused to function as the ground plane of the monopole antenna. Further, in a case in which a base such as a lead frame on which the semiconductor device 100 is mounted is used as the ground plane of the monopole antenna, it is possible to increase an area of the ground plane and to expect an effect of improvement of radiation efficiency of radio waves that are used for wireless communication due to electrically connecting the second antenna element A2 to the base such as a lead frame. Further, by constituting the ground plane using the rewiring provided within the semiconductor device, it is possible to improve the stability of a radio wave transmission and reception state as compared with a case in which the ground plane is not provided within the semiconductor device.

In this embodiment, the case in which the first antenna element A1 formed in the first rewiring layer is used as the antenna line in the monopole antenna, and the second antenna element A2 formed in the second rewiring layer is used as the ground plane of the monopole antenna is illustrated. However, the first antenna element A1 may be caused to have an island-like pattern and function as the ground plane of the monopole antenna, and the second antenna element A2 may be caused to have a line pattern and function as the antenna line of the monopole antenna.

Second Embodiment

Figure 6A:
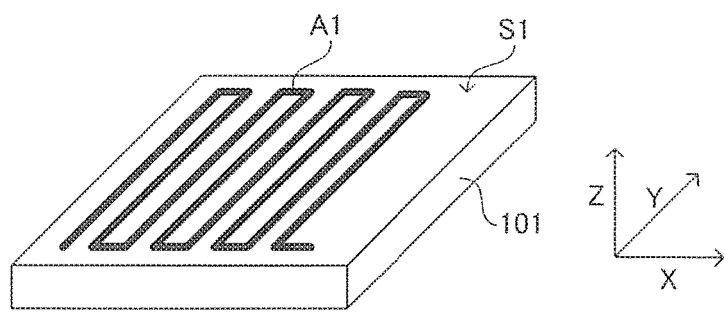
FIG. 6A is a perspective view schematically illustrating a pattern of a first antenna element according to an embodiment of the invention.
Figure 6B:
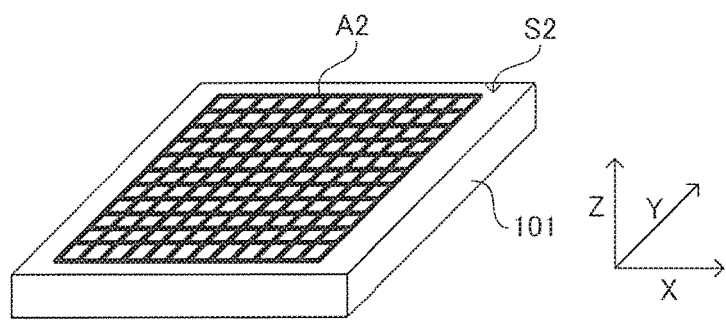
FIG. 6B is a perspective view schematically illustrating a pattern of a second antenna element according to an embodiment of the invention.

FIG. 6A is a perspective view schematically illustrating a pattern of a first antenna element A1 formed in a first rewiring layer 102 in a semiconductor device according to a second embodiment of the invention. FIG. 6B is a perspective view schematically illustrating a pattern of a second antenna element A2 formed in a second rewiring layer 103 in the semiconductor device according to the second embodiment of the invention.

In the semiconductor device according to the second embodiment, a pattern of the second antenna element A2 is different from the pattern of the second antenna element A2 according to the first embodiment. As illustrated in FIG. 6B, the antenna element A2 according to the second embodiment has a grid-like pattern (mesh pattern) in which a plurality of wirings extending in an X direction and a plurality of wirings extending in a Y direction intersect. A length of one side of each grid square is sufficiently shorter than a wavelength of radio waves that are used for wireless communication. Thus, since the length of one side of each grid is sufficiently shorter than the wavelength of the radio waves, it is possible to cause the second antenna element A2 to function as the ground plane of a monopole antenna, as in a case in which the second antenna element A2 has an island-like pattern.

Since the pattern of the second antenna element A2 is the grid-like pattern, it is possible to reduce the amount of use of a conductor (for example, Cu) serving as a material of the second antenna element A2 and achieve a low cost, as compared with a case in which the pattern of the second antenna element A2 is an island-like pattern.

Third Embodiment

Figure 7A:
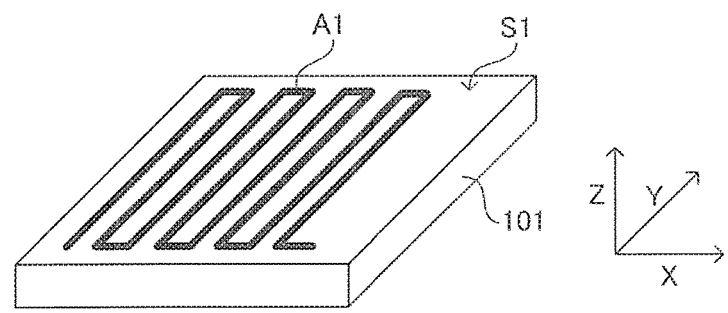
FIG. 7A is a perspective view schematically illustrating a pattern of a first antenna element according to an embodiment of the invention.
Figure 7B:
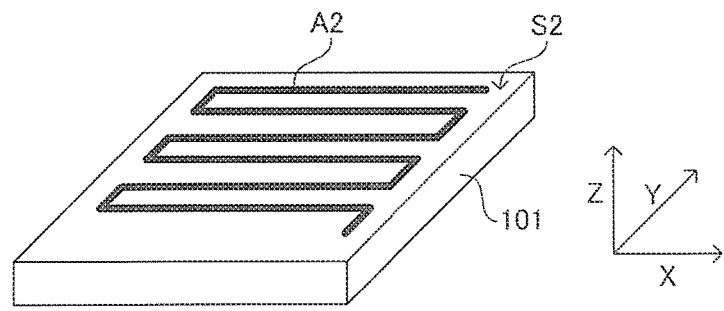
FIG. 7B is a perspective view schematically illustrating a pattern of a second antenna element according to an embodiment of the invention.
Figure 8:
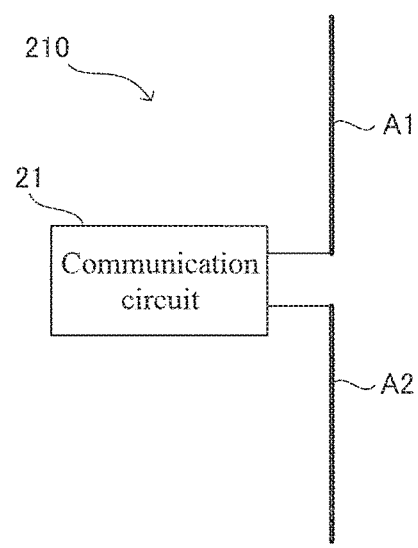
FIG. 8 is a diagram illustrating a configuration of a communication unit according to an embodiment of the invention.

FIG. 7A is a perspective view schematically illustrating a pattern of a first antenna element A1 formed in a first rewiring layer 102 in a semiconductor device according to a third embodiment of the invention. FIG. 7B is a perspective view schematically illustrating a pattern of a second antenna element A2 formed in a second rewiring layer 103 in the semiconductor device according to the third embodiment of the invention. FIG. 8 is a diagram illustrating a configuration of a communication unit 210 according to the third embodiment of the invention including a communication circuit 21, a first antenna element A1, and a second antenna element A2.

In the semiconductor devices according to the first and second embodiments, the second antenna element A2 functions as a ground plane of the monopole antenna. On the other hand, in the semiconductor device according to the third embodiment, the first antenna element A1 and the second antenna element A2 constitute a dipole antenna.

As illustrated in FIG. 7A, the first antenna element A1 has a one line pattern in which a rewiring is caused to reciprocate meanderingly in a Y direction parallel to a side of the semiconductor chip 101. As illustrated in FIG. 7B, the second antenna element A2 has a one line pattern in which a rewiring is caused to reciprocate meanderingly in an X direction orthogonal to the Y direction.

Since an extension direction of an antenna line is changed in the first antenna element A1 and the second antenna element A2 in this way, the first antenna element A1 and the second antenna element A2 have different directivities. Accordingly, the first antenna element A1 operates to compensate for a direction in which an antenna gain of the second antenna element A2 is low, and the second antenna element A2 operates to compensate for a direction in which an antenna gain of the first antenna element A1 is low.

Although the case in which the directivity is made different between the first antenna element A1 and the second antenna element A2 by changing the extension direction of the antenna line in the first antenna element A1 and the second antenna element A2 has been illustrated in this embodiment, radiation characteristics of the antenna including the directivity may be made different between the first antenna element A1 and the second antenna element A2 by changing at least one of a length, a shape, the extension direction, and an arrangement of the antenna line in the first antenna element A1 and the second antenna element A2. Further, the first antenna element A1 and the second antenna element A2 may be formed in the same pattern and configured to have the same directivity.

Fourth Embodiment

Figure 9:
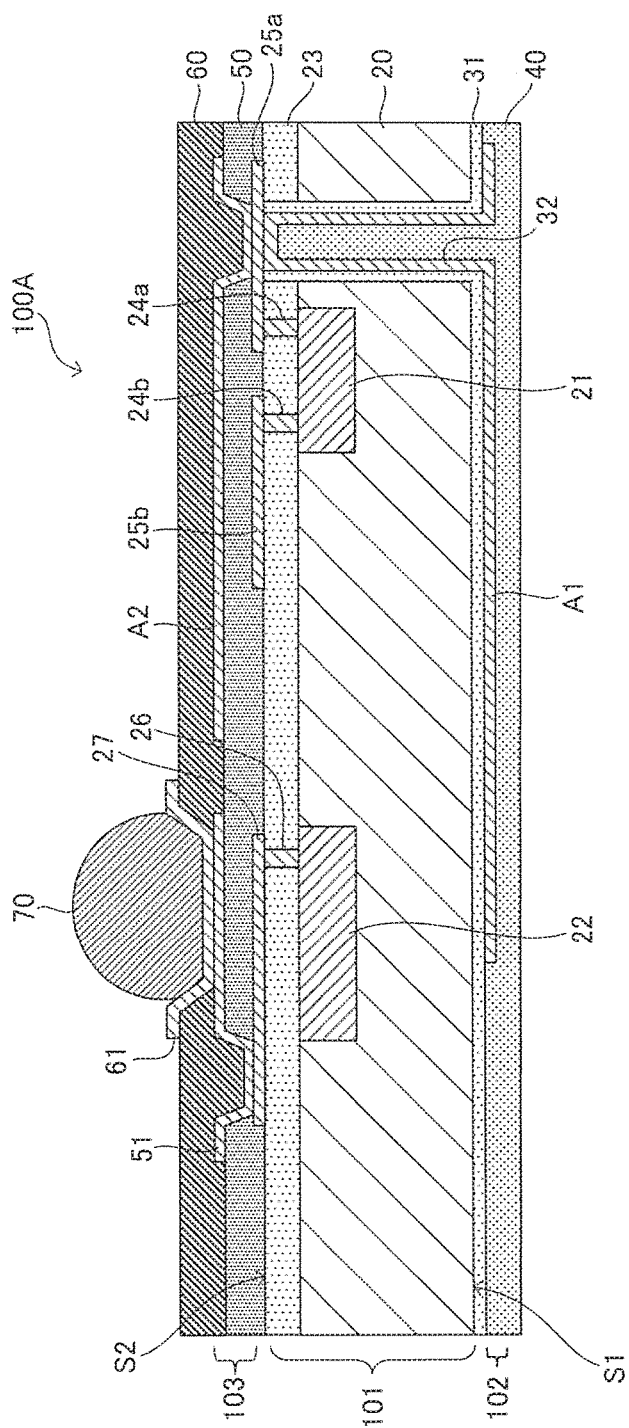
FIG. 9 is a cross-sectional view illustrating a configuration of a semiconductor device according to an embodiment of the invention.

FIG. 9 is a cross-sectional view illustrating a configuration of a semiconductor device 100A according to a fourth embodiment of the invention. In the semiconductor device 100A, both a first antenna element A1 formed in a first rewiring layer 102 and a second antenna element A2 formed in a second rewiring layer 103 are connected to an electrode pad 25a. That is, the first antenna element A1 and the second antenna element A2 are connected to each other, and the first antenna element A1 and the second antenna element A2 constitute a single integral antenna element.

Figure 10:
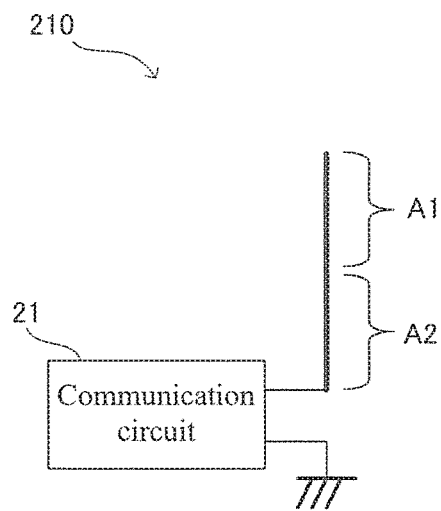
FIG. 10 is a diagram illustrating a configuration of a communication unit according to an embodiment of the invention.

FIG. 10 is a diagram illustrating a configuration of a communication unit 210 according to the fourth embodiment of the invention including a communication circuit 21, the first antenna element A1, and the second antenna element A2. The first antenna element A1 and the second antenna element A2 connected to each other function as antenna lines of a monopole antenna. A base such as a lead frame on which the semiconductor device 100A is mounted may be used as a ground plane of the monopole antenna.

Figure 11A:
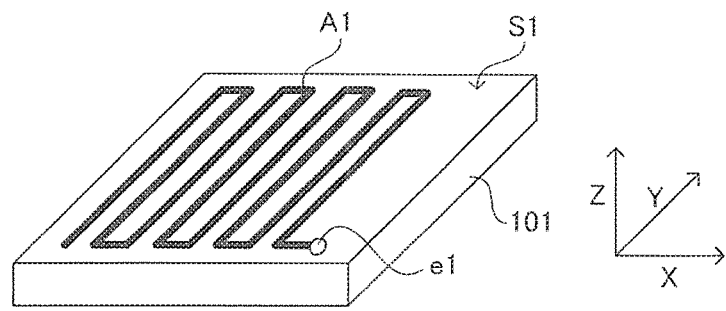
FIG. 11A is a perspective view schematically illustrating a pattern of a first antenna element according to an embodiment of the invention.
Figure 11B:
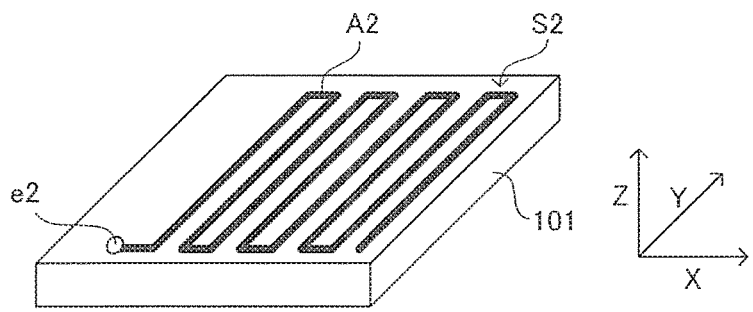
FIG. 11B is a perspective view schematically illustrating a pattern of a second antenna element according to an embodiment of the invention.

FIG. 11A is a perspective view schematically illustrating a pattern of the first antenna element A1 formed in the first rewiring layer in the semiconductor device 100A. FIG. 11B is a perspective view schematically illustrating a pattern of the second antenna element A2 formed in the second rewiring layer 103 in the semiconductor device 100A. The first antenna element A1 and the second antenna element A2 have a line pattern in which a rewiring is caused to meanderingly reciprocate in a Y direction parallel to a side of the semiconductor chip 101. An end portion e1 of the first antenna element A1 is connected to an end portion e2 of the second antenna element A2 via a through electrode 32.

As described above, according to the semiconductor device 100A of this embodiment, the first antenna element A1 and the second antenna element A2 are connected to each other, and the first antenna element A1 and the second antenna element A2 constitute a single integral antenna element. Accordingly, it is also possible to realize antenna performance that is difficult to realize with only the antenna element formed in the rewiring layer covering one of surfaces of the semiconductor chip. In particular, it is possible to constitute a longer antenna line by connecting the first antenna element A1 to the second antenna element A2.

Figure 12A:
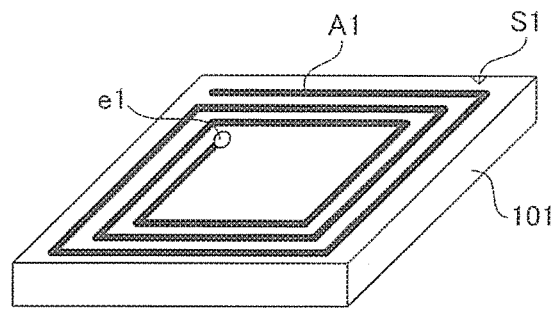
FIG. 12A is a perspective view schematically illustrating a pattern of a first antenna element according to an embodiment of the invention.
Figure 12B:
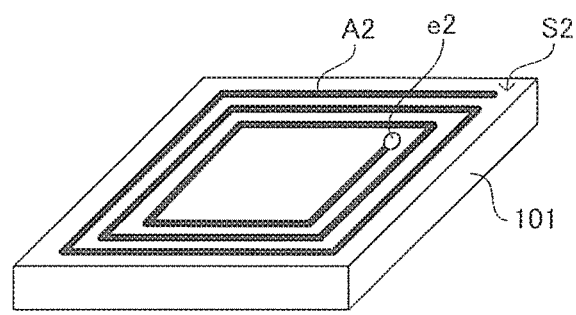
FIG. 12B is a perspective view schematically illustrating a pattern of a second antenna element according to an embodiment of the invention.

FIGS. 12A and 12B are perspective views schematically illustrating another example of the pattern of the first antenna element A1 and the second antenna element A2, respectively. As illustrated in FIGS. 12A and 12B, the first antenna element A1 and the second antenna element A2 may have a spiral pattern along respective sides of the semiconductor chip 101. An end portion e1 of the first antenna element A1 is connected to an end portion e2 of the second antenna element A2 via the through electrode 32.

A configuration of the antenna elements of the semiconductor devices according to the first to fourth embodiments of the invention described above can be combined appropriately. For example, the first antenna element A1 having the line pattern illustrated in FIG. 3A and the second antenna element A2 having the island-like pattern illustrated in FIG. 3B may be connected to each other via the through electrode. Similarly, the first antenna element A1 having the line pattern illustrated in FIG. 6A and the second antenna element A2 having the gird-like pattern illustrated in FIG. 6B may be connected to each other via the through electrode. Further, the meandering pattern illustrated in FIGS. 3A, 7A, and 7B can be changed to the spiral pattern as illustrated in FIGS. 12A and 12B. Further, the pattern of the first antenna element A1 and the second antenna element A2 is not limited to the meandering pattern, the spiral pattern, the island-like pattern, and the grid-like pattern described above and can also be configured in any pattern. Further, the first antenna element A1 and the second antenna element A2 may include rewirings of a plurality of stacked rewiring layers. For example, the first antenna element A1 may include a rewiring of a first layer and a rewiring of a second layer covering the first surface S1 of the semiconductor chip. The same applies to the second antenna element A2.

Fifth Embodiment

Figure 13A:
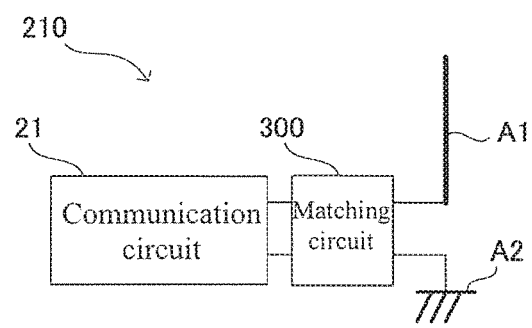
FIG. 13A is a diagram illustrating a configuration of a communication unit according to an embodiment of the invention.
Figure 13B:
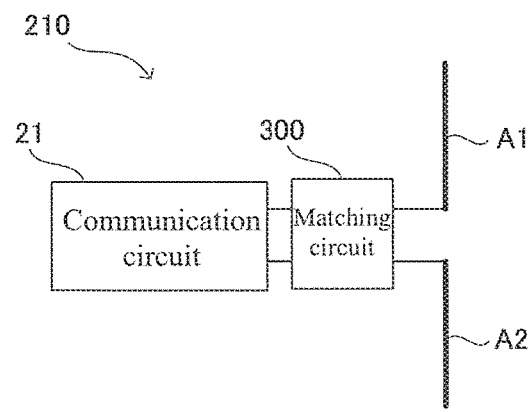
FIG. 13B is a diagram illustrating a configuration of a communication unit according to the embodiment of the invention.
Figure 13C:
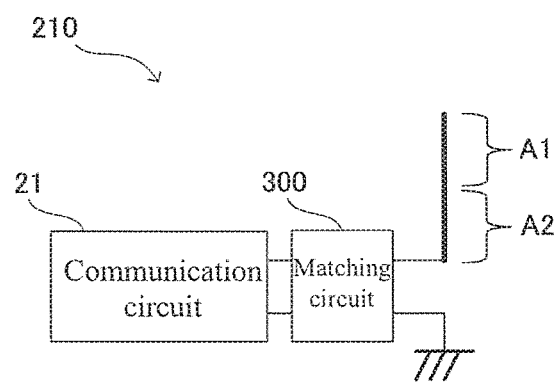
FIG. 13C is a diagram illustrating a configuration of a communication unit according to the embodiment of the invention.

FIGS. 13A, 13B, and 13C are diagrams illustrating a configuration of a communication unit 210 according to a fifth embodiment of the invention. The communication unit 210 may further include a matching circuit 300 provided between a first antenna element A1 and a second antenna element A2, and a communication circuit 21. The first antenna element A1 is formed in a first rewiring layer 102, and the second antenna element A2 is formed in a second rewiring layer 103.

The matching circuit 300 includes, for example, circuit elements such as a capacitor and an inductor, and serves to match impedances between the communication circuit 21, and the first antenna element A1 and the second antenna element A2. The circuit elements constituting the matching circuit 300 may include, for example, discrete components separate from the semiconductor chip 101. In this case, a form in which the discrete components constituting the matching circuit 300 are mounted on the first surface S1 or the second surface S2 of the semiconductor chip 101, and the discrete components constituting the matching circuit 300 are connected to at least one of the first antenna element A1 and the second antenna element A2 may be adopted.

Sixth Embodiment

Figure 14:
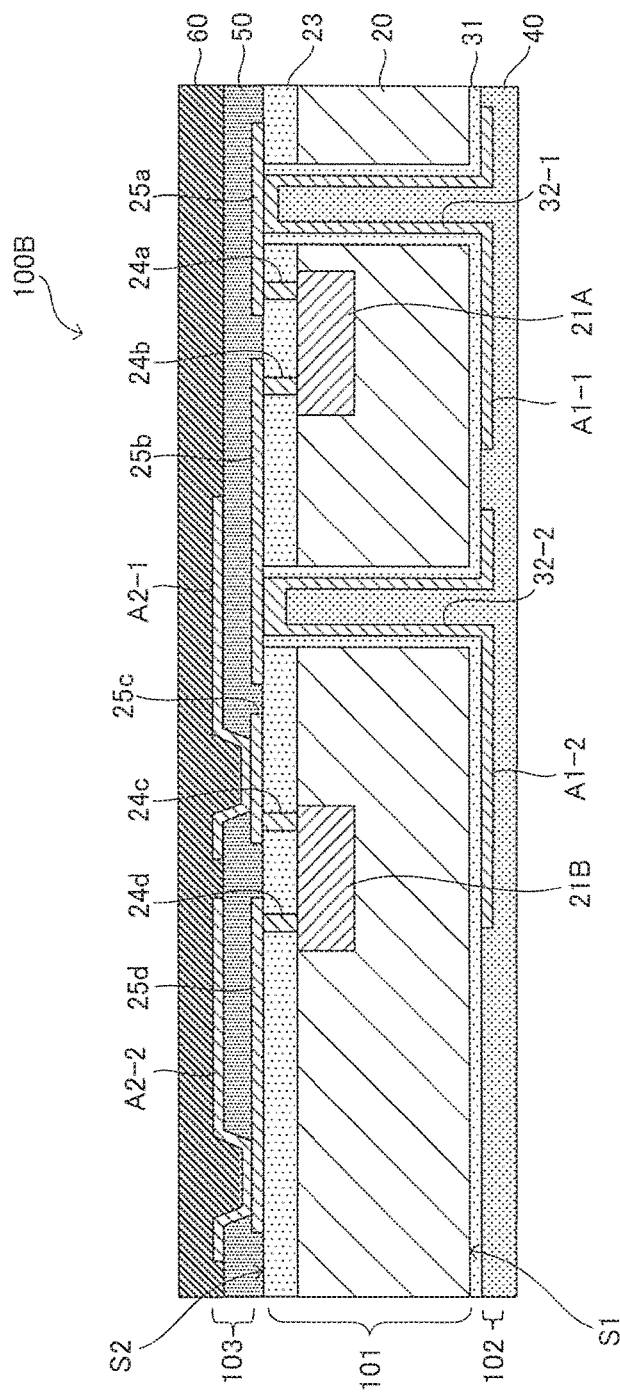
FIG. 14 is a cross-sectional view illustrating a configuration of a semiconductor device according to an embodiment of the invention.
Figure 15:
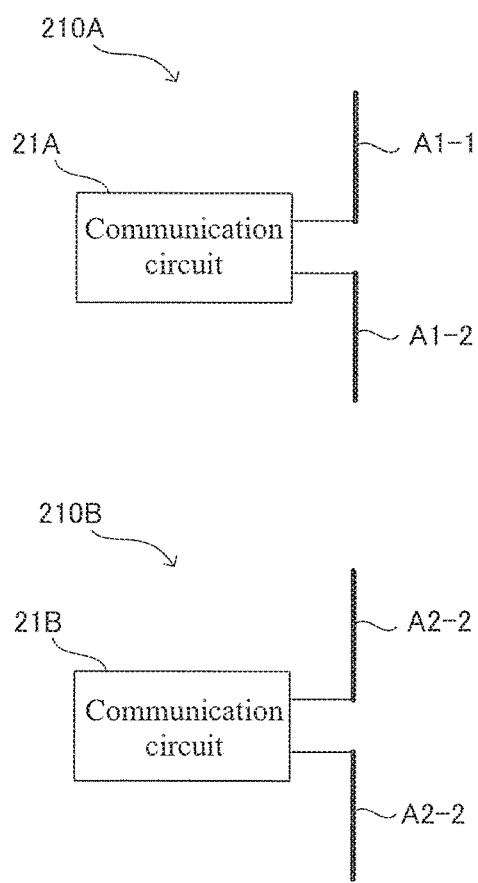
FIG. 15 is a diagram illustrating a configuration of two communication units according to an embodiment of the invention.

FIG. 14 is a cross-sectional view illustrating a configuration of a semiconductor device 100B according to a sixth embodiment of the invention. FIG. 15 is a diagram illustrating a configuration of two communication units 210A and 210B provided in the semiconductor device 100B.

The communication unit 210A includes a communication circuit 21A formed in a semiconductor chip 101, and antenna elements A1-1 and A1-2 formed in a first rewiring layer 102 covering a first surface S1 of the semiconductor chip 101. The antenna elements A1-1 and A1-2 have, for example, a line pattern as illustrated in FIG. 3A, and these constitute a dipole antenna. As illustrated in FIG. 14, the antenna element A1-1 is connected to the communication circuit 21A via a through electrode 32-1, an electrode pad 25a, and a via 24a, and the antenna element A1-2 is connected to the communication circuit 21A via a through electrode 32-2, an electrode pad 25b, and a via 24b.

On the other hand, the communication unit 210B includes a communication circuit 21B formed in the semiconductor chip 101, and antenna elements A2-1 and A2-2 formed in a second rewiring layer 103 covering a second surface S2 of the semiconductor chip 101. The antenna elements A2-1 and A2-2 have, for example, a line pattern as illustrated in FIG. 3A, and constitute a dipole antenna. As illustrated in FIG. 14, the antenna element A2-1 is connected to the communication circuit 21B via an electrode pad 25c and a via 24c, and the antenna element A2-2 is connected to the communication circuit 21B via an electrode pad 25d and a via 24d.

In each of the communication units 210A and 210B, one of the antenna elements may be constituted by a rewiring formed in the first rewiring layer 102, and the other of the antenna elements may be constituted by a rewiring formed in the second rewiring layer 103.

Thus, the semiconductor device 100B includes a plurality of communication units to be able to constitute a diversity antenna. Although the case in which the semiconductor device 100B includes the two communication units 210A and 210B is illustrated, the semiconductor device 100B may include three or more communication units. In the semiconductor device 100B, the power supply circuit 22 or the electrode pad 27 illustrated in FIG. 1 may be provided in the semiconductor chip 101.

Seventh Embodiment

Figure 16:
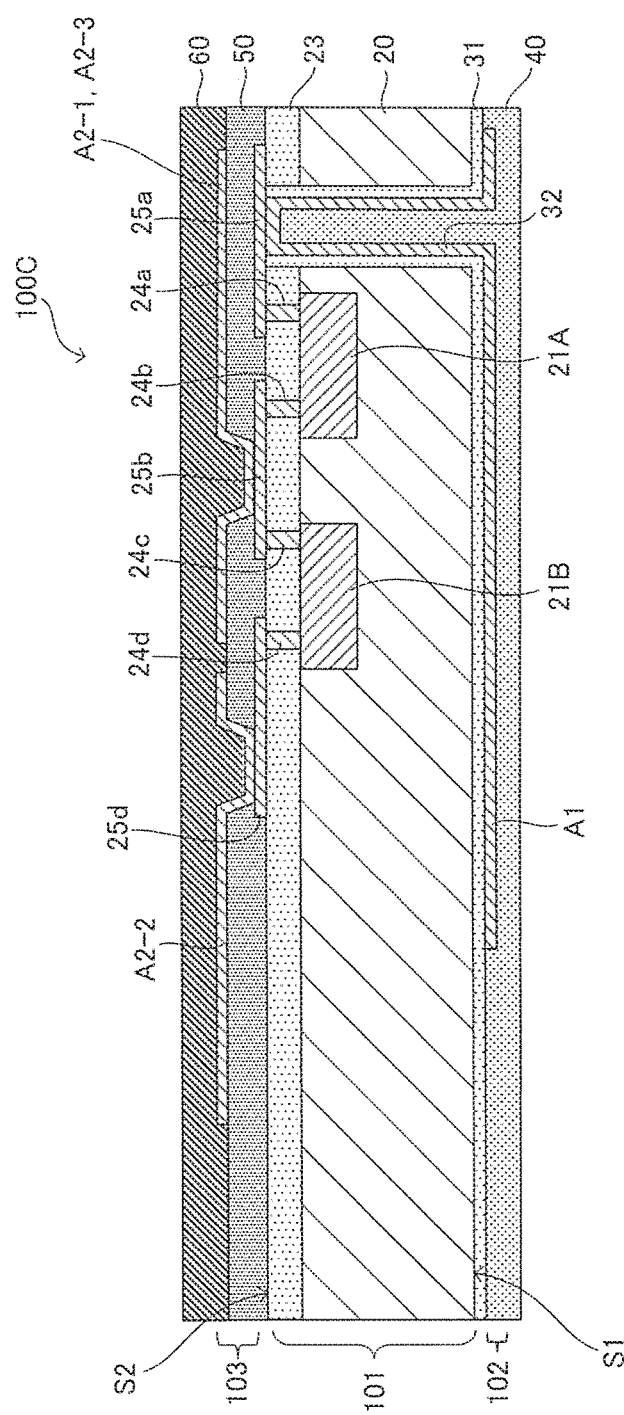
FIG. 16 is a cross-sectional view illustrating a configuration of a semiconductor device according to an embodiment of the invention.
Figure 17:
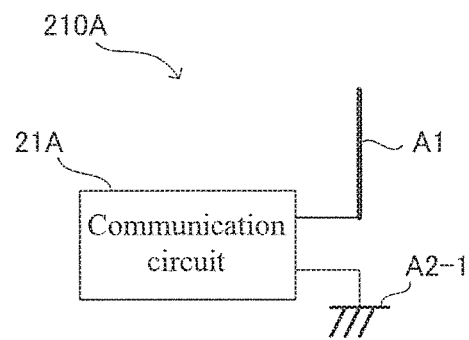
FIG. 17 is a diagram illustrating a configuration of two communication units according to an embodiment of the invention.
Figure 17:
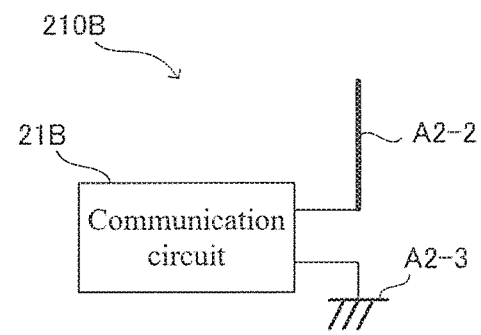
Figure 18A:
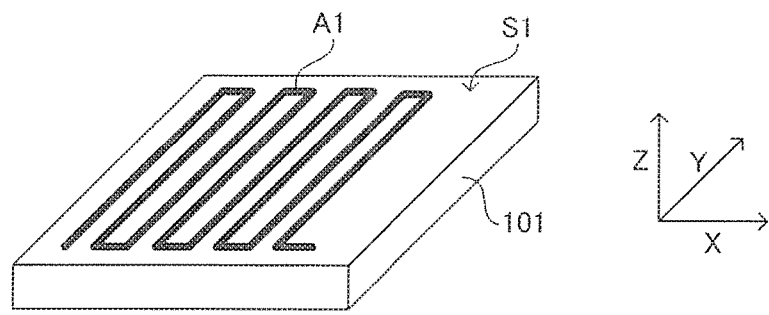
FIG. 18A is a perspective view schematically illustrating a pattern of an antenna element according to an embodiment of the invention.
Figure 18B:
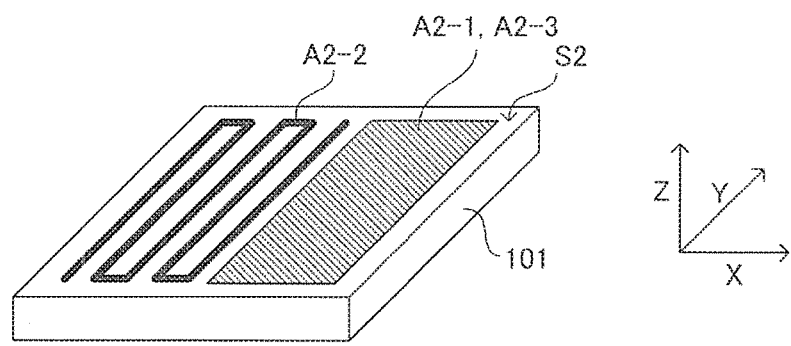
FIG. 18B is a perspective view schematically illustrating a pattern of an antenna element according to an embodiment of the invention.

FIG. 16 is a cross-sectional view illustrating a configuration of a semiconductor device 100C according to a seventh embodiment of the invention. FIG. 17 is a diagram illustrating a configuration of two communication units 210A and 210B included in the semiconductor device 100C. FIG. 18A is a perspective view schematically illustrating a pattern of an antenna element A1 formed in a first rewiring layer 102 in the semiconductor device 100C. FIG. 18B is a perspective view schematically illustrating a pattern of second antenna elements A2-1, A2-2, and A2-3 formed in a second rewiring layer 103 in the semiconductor device 100C.

The communication unit 210A includes a communication circuit 21A formed in the semiconductor chip 101, the antenna element A1 formed in a first rewiring layer 102 covering a first surface S1 of the semiconductor chip 101, and the antenna element A2-1 that is formed in a second rewiring layer 103 covering a second surface S2 of the semiconductor chip 101 and to which a ground potential is applied. The antenna element A1 has, for example, a line pattern as illustrated in FIG. 18A, the antenna element A2-1 has, for example, an island-like pattern as illustrated in FIG. 18B, and these constitute a monopole antenna. The antenna element A2-1 may have a grid-like pattern as illustrated in FIG. 6B. As illustrated in FIG. 16, the antenna element A1 is connected to the communication circuit 21A via a through electrode 32, an electrode pad 25a, and a via 24a, and the antenna element A2-1 is connected to the communication circuit 21A via an electrode pad 25b and a via 24b.

On the other hand, the communication unit 210B includes a communication circuit 21B formed in the semiconductor chip 101, the antenna element A2-2 formed in the second rewiring layer 103 covering a second surface S2 of the semiconductor chip 101, and the antenna element A2-3 that is formed in the second rewiring layer 103 covering the second surface S2 of the semiconductor chip 101 and to which the ground potential is applied. The antenna element A2-2 has, for example, a line pattern as illustrated in FIG. 18B, the antenna element A2-3 has, for example, an island-like pattern as illustrated in FIG. 18B, and these constitute a monopole antenna. The antenna element A2-3 may have a grid-like pattern as illustrated in FIG. 6B. As illustrated in FIG. 16, the antenna element A2-2 is connected to the communication circuit 21B via the electrode pad 25d and a via 24d, and the antenna element A2-3 is connected to the communication circuit 21B via an electrode pad 25b and a via 24c.

The antenna elements A2-1 and A2-3 to which the ground potential is applied may be formed of a common rewiring formed in the second rewiring layer 103, as illustrated in FIG. 16. Further, in the second communication unit 210B, the antenna element A2-2 constituting the antenna line of the monopole antenna may be formed of a rewiring formed in the first rewiring layer 102.

Thus, the semiconductor device 100C includes a plurality of communication units to be able to constitute a diversity antenna. Although the case in which the semiconductor device 100C includes the two communication units 210A and 210B is illustrated, the semiconductor device 100C may include three or more communication units. Further, in the semiconductor device 100C, the power supply circuit 22 or the electrode pad 27 illustrated in FIG. 1 may be provided in the semiconductor chip 101.

What is claimed is:

1. A semiconductor device, comprising:
   a first antenna element and a second antenna element receiving a first signal from a communication device provided outside the semiconductor device; and
   a semiconductor chip including a communication circuit provided between the first antenna element and the second antenna element, the communication circuit being connected to the first and second antenna elements,
   wherein the first antenna element and the second antenna element are disposed on opposite surfaces of the semiconductor chip,
   the second antenna element to which a ground potential is applied has a grid pattern which is formed by first wirings extending in a first direction and intersecting with second wirings extending in a second direction orthogonal to the first direction, and
   the first antenna element has a one-line pattern which reciprocates meanderingly in the first direction parallel to one of the opposite surfaces of the semiconductor chip.

* * * * *